United States Patent [19]
Kosonocky et al.

[11] Patent Number: 5,245,572
[45] Date of Patent: Sep. 14, 1993

[54] FLOATING GATE NONVOLATILE MEMORY WITH READING WHILE WRITING CAPABILITY

[75] Inventors: George A. Kosonocky, Placerville; Mark D. Winston, El Dorado Hills, both of Calif.

[73] Assignee: Intel Corporation, Santa Clara, Calif.

[21] Appl. No.: 738,179

[22] Filed: Jul. 30, 1991

[51] Int. Cl.$^5$ .................................................. G11C 7/00
[52] U.S. Cl. ............................ 365/189.02; 365/185; 365/218; 365/230.03
[58] Field of Search ..................... 365/189.02, 230.03, 365/185, 218, 900

[56] References Cited

U.S. PATENT DOCUMENTS

| | | | |
|---|---|---|---|
| 4,450,538 | 5/1984 | Shirasaka | 365/189.02 |
| 4,835,684 | 5/1989 | Kanai | 365/230.03 X |
| 4,839,860 | 6/1989 | Shinoda et al. | 365/230.03 X |
| 4,961,172 | 10/1990 | Shubat et al. | 365/230.03 X |
| 5,036,494 | 7/1991 | Wise et al. | 365/230.03 |
| 5,043,947 | 8/1991 | Oshima et al. | 365/230.03 |

OTHER PUBLICATIONS

S. Zales & D. Elbert, "Using Flash Memory For In-System Reprogrammable Nonvolatile Storage," Application Note AP-316, Intel Memory Components Handbook, pp. 5-72 through 5-114 (Intel Corp., Oct. 1989).

Primary Examiner—Eugene R. LaRoche
Assistant Examiner—Do Hyum Yoo
Attorney, Agent, or Firm—Blakely, Sokoloff, Taylor & Zafman

[57] ABSTRACT

A floating gate nonvolatile memory. The memory includes a first memory array and a second memory array. A first address register is provided for storing a first address for the first memory array. A second address register is provided for storing a second address for the second memory array. A multiplexer is coupled to the first memory array and the second memory array at one end and an output of the memory device at the other end for selectively coupling one of the first memory array and the second memory array to the output at a time. Array select circuitry responsive to an incoming address is provided for selecting the first memory array for a reprogramming operation and the second memory array for a read operation. The array select circuitry directs the first address to the first address register and the second address to the second address register. The array select circuitry controls the multiplexer for coupling the second memory array to the output during the reprogramming operation of the first memory array.

9 Claims, 3 Drawing Sheets

FIG_1 (PRIOR ART)

FIG_2

FIG—3

FLOATING GATE NONVOLATILE MEMORY WITH READING WHILE WRITING CAPABILITY

FIELD OF THE INVENTION

The present invention pertains to the field of floating gate nonvolatile read-only memories. More particularly, the present invention relates to floating gate memories that can be read from while being written to.

BACKGROUND OF THE INVENTION

One type of prior nonvolatile computer memory is the flash electrically erasable and programmable read-only memory ("flash EPROM"). The flash EPROM can be programmed by a user, and once programmed, the flash EPROM retains its data until erased. Once programmed, the entire contents of the flash EPROM can be erased by electrical erasure in one relatively rapid operation. The flash EPROM may then be reprogrammed with new data.

One prior use of flash EPROMs is in microprocessor-based systems as in-system reprogrammable nonvolatile storage means. Given that flash EPROMs are electrically erasable and programmable, flash EPROMs typically offer cost-effective means for storing and updating programs. A central processing unit ("CPU") can reprogram a flash EPROM and this reprogramming is referred to as in-system writing ("ISW"). With ISW, the CPU controls the reprogramming of the flash EPROM and the programming voltage $V_{PP}$ is generated locally within the system.

Figure 1:
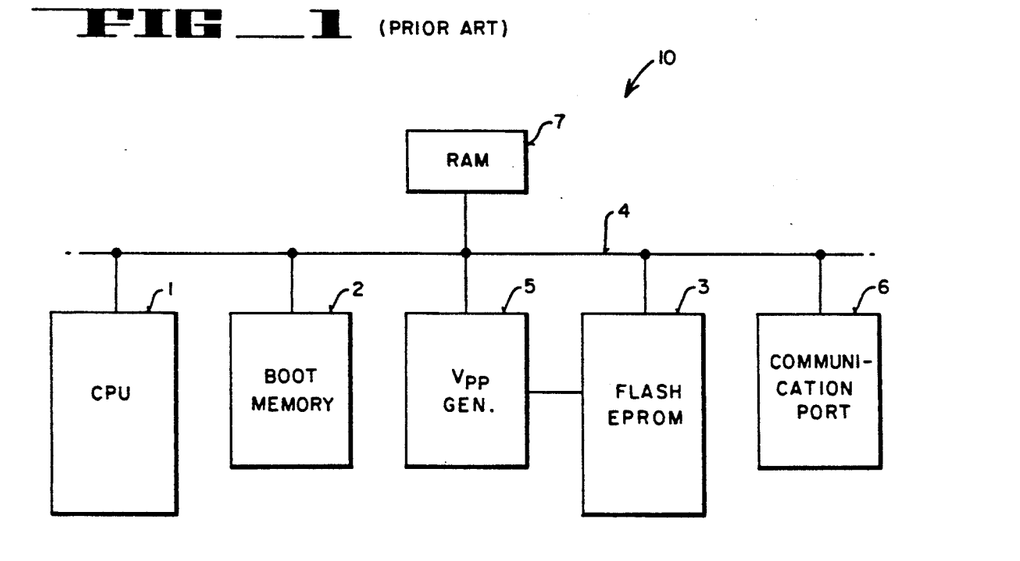
FIG. 1 is a block diagram of a microprocessor system with a prior art flash EPROM.

FIG. 1 illustrates in block diagram one prior microprocessor system 10 with ISW capability. System 10 includes a CPU 1 that controls the reprogramming of flash EPROM 3. A communication port 6 links microprocessor system 10 to a host computer (not shown) via bus 4. The host computer contains the code and data that is to be programmed into flash EPROM 3. The code and data is supplied to CPU 1 via communication port 6.

Microprocessor system 10 also includes a boot memory 2 that stores (1) CPU boot code for system initialization, (2) communication software, and (3) reprogramming algorithms for ISW of flash EPROM 3. The boot code includes I/O drivers, ASCII to binary conversion tables, and routines for hardware initialization. Boot memory 2 is any type of nonvolatile memory device, such as a ROM or an EPROM erasable with ultraviolet light.

Prior microprocessor system 10 also typically includes RAM 7 and $V_{PP}$ generator 5. RAM 7 is used for storing code and data that changes. $V_{PP}$ generator 5 supplies the program/erase voltage $V_{PP}$ for the reprogramming of flash EPROM 3. $V_{PP}$ is typically about 12 volts.

One disadvantage of system 10 is that flash EPROM 3 cannot be read while it is being programmed or reprogrammed. Thus, CPU 1 is typically idle while flash EPROM 3 is being programmed The erasure of flash EPROM 3 typically takes about 0.5 to 30 seconds. The programming of a byte of a flash EPROM 3 typically takes about 16 to 400 microseconds. The programming time of a flash EPROM 3 depends upon the size of the memory array of flash EPROM 3.

To erase flash EPROM 3, CPU 1 sends an erasure command to a command register of flash EPROM 3. CPU 1 then sends an erase verify command to flash EPROM 3 to stop erasure and start erase verification.

To program flash EPROM 3, CPU 1 sends a program command to a command register of flash EPROM 3. An address and data are then latched into flash EPROM 3 and programming starts. CPU 1 then sends a program verify command to flash EPROM 3 to terminate programming and program verification.

Another disadvantage associated with prior system 10 is its hardware requirements. System 10 typically requires nonvolatile boot memory 2 to store the boot code and reprogramming algorithms. System 10 also typically requires RAM 7. Boot memory 2 and RAM 7 each have associated peripheral circuitry. That peripheral circuitry typically includes decoders, address latches, and input/output buffers.

One prior approach to solving this problem is to store boot information in a boot area is flash EPROM 3 and eliminate boot memory 2. When flash EPROM 3 is to be written to (i.e., reprogrammed), CPU 1 first loads the reprogramming algorithms and the communication software from the boot area of flash EPROM 3 into RAM 7. CPU then executes the reprogramming algorithms stored in RAM 7 and thus carries out the ISW reprogramming of flash EPROM 3.

One disadvantage of this prior approach is that the boot information takes up portions of both RAM 7 and flash EPROM 3. Depending upon the system requirements, this may require a larger RAM 7. Another disadvantage of this prior approach is that it requires extra CPU time for ISW. That extra time includes the time it takes to load RAM 7 with the boot information.

SUMMARY AND OBJECTS OF THE INVENTION

One object of the present invention is to provide a nonvolatile memory that can be read from while being reprogrammed.

Another object of the present invention is to provide a nonvolatile memory that includes separate memory arrays that can be simultaneously addressed for separate memory operations.

A floating gate nonvolatile memory is described. The memory includes a first memory array and a second memory array. A first address register is provided for storing a first address for the first memory array. A second address register is provided for storing a second address for the second memory array. A multiplexer is coupled to the first memory array and the second memory array at one end and an output of the memory device at the other end for selectively coupling one of the first memory array and the second memory array to the output at a time. Array select circuitry responsive to an incoming address is provided for selecting the first memory array for a reprogramming operation and the second memory array for a read operation. The array select circuitry directs the first address to the first address register and the second address to the second address register. The array select circuitry controls the multiplexer for coupling the second memory array to the output during the reprogramming operation of the first memory array.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 3 is a block diagram of the flash EPROM of FIG. 2;

DETAILED DESCRIPTION

Figure 2:
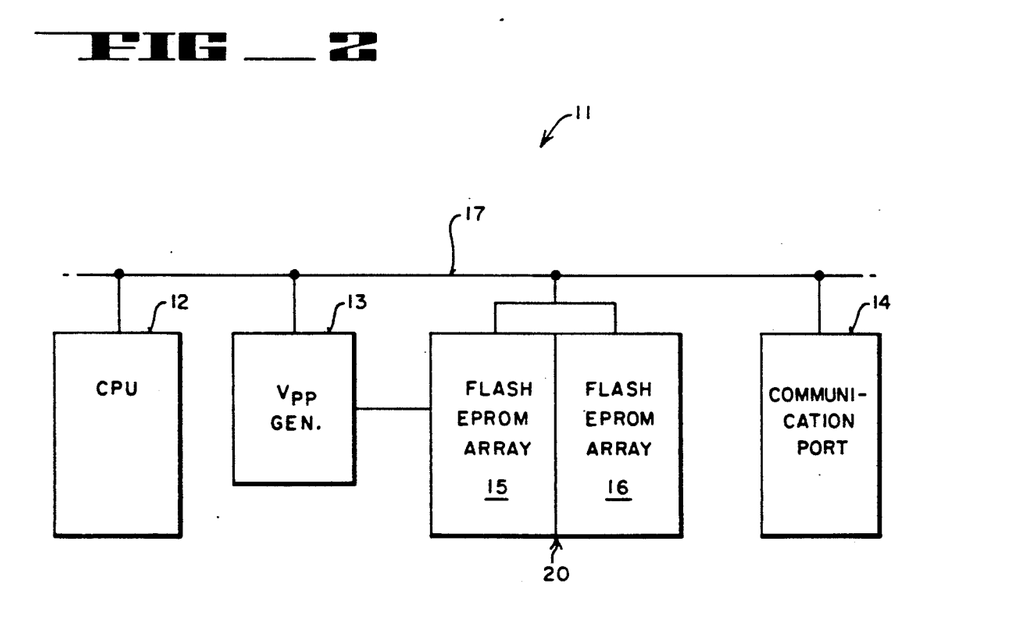
FIG. 2 is a block diagram of a microprocessor system with a flash EPROM with two memory arrays.

FIG. 2 illustrates in block diagram form microprocessor system 11 that includes preferred flash EPROM 20. Microprocessor system 11 provides ISW with respect to flash EPROM 20. Flash EPROM 20 can be read while it is being written to as part of an ISW operation.

System 11 includes flash EPROM 20, central processing unit ("CPU") 12, communication port 14, $V_{PP}$ generator 13, and bus 17. CPU 12 is the microprocessor of system 11. CPU 12, also referred to as microprocessor 12, performs among its functions the ISW of flash EPROM 20. Communication port 14 provides communication with other computer systems (not shown) and allows system 10 to receive data for the reprogramming of flash EPROM 20. $V_{PP}$ generator 13 generates the program/erase Vpp voltage used for the reprogramming of flash EPROM 20. In one embodiment, Vpp is approximately 12 volts. Bus 17 interconnects CPU 12, $V_{PP}$ generator 13, flash EPROM 20, and communication port 14 within system 11.

In one preferred embodiment, flash EPROM 20 includes two memory arrays—namely, array 15 and array 16. Memory arrays 15 and 16 can each be separately read, programmed, and erased by CPU 12.

In alternative embodiments, flash memory 20 can include three or more memory arrays.

Flash EPROM 20 resides on a single substrate. Each one of memory arrays 15 and 16 has its own address register and decoder. Nevertheless, arrays 15 and 16 share other common peripheral circuitry within flash EPROM 20. One of the memory arrays 15 and 16 can be accessed while the other is being programmed. For example, during the erasure and reprogramming of memory array 15, CPU 12 can read memory array 16. This allows CPU 12 to perform tasks that require access to information stored in flash EPROM 20 during the reprogramming of flash EPROM 20.

In a preferred embodiment, boot information is stored in flash EPROM 20. The dual array structure of flash array 20 allows the boot information to be retained within flash memory 20 even during reprogramming.

FIG. 3 is a block diagram of flash EPROM 20. Flash EPROM 20 includes two memory arrays 15 and 16, both of which are made up of memory cells (not shown) that store data at addresses. In one embodiment, memory arrays 15 and 16 each store 512 Kilobits ("KB") of data. In alternative embodiments, memory arrays 15 and 16 can be larger or smaller.

In a preferred embodiment, flash EPROM 20 employs complementary metal oxide semiconductor ("CMOS") circuitry on a single substrate.

In one embodiment, each of memory arrays 15 and 16 is organized into rows and columns. Each memory cell in arrays 15 and 16 resides at a intersection of a word line (not shown) and a bit line (not shown). Each word line in arrays 15 and 16 is connected to the control gates of memory cells residing in one row. Each bit line in memory arrays 15 and 16 is connected to the drain regions of the memory cells in one column. The sources of the memory cells in array 15 are connected to a common source line (not shown). The sources of the memory cells in array 16 are connected to a common source line (not shown) that is separate from and not connected to the source line of array 15.

In one embodiment, memory arrays 15 and 16 are each organized into bit line blocks by arranging bit lines into groups.

In another embodiment, arrays 15 and 16 are organized into word line blocks by organizing the word lines into groups.

In the embodiment in which memory arrays 15 and 16 are arranged into bit line blocks; each block includes a plurality of bit lines. The word lines extend through all blocks within one memory array and are therefore shared by memory cells in all the blocks within the memory array. Each block also includes one common source line that is connected to the sources of all the cells within one block.

In the embodiment in which memory arrays 15 and 16 are arranged into word line blocks, each block includes a plurality of word lines. The bit lines extend through all the blocks within one memory array and are therefore shared by memory cells in all the blocks within the array. Each block also includes one common source line that is connected to the sources of all the cells within one block.

In one embodiment, each of the memory arrays 15 and 16 of flash EPROM 20 includes an 8 Kilobyte boot block and two 4 Kilobyte parameter blocks. The boot blocks store, for example, the boot code for system initialization, reprogramming algorithms, and communication software. The parameter blocks store frequently updated system parameters and configuration information. Given that the boot blocks are not intended to be frequently updated, a reprogramming write lock out feature is included to help to ensure data integrity.

FIG. 3 illustrates flash EPROM 20 in more detail. EPROM 20 includes memory array 15 and memory array 16. Flash EPROM 20 includes an output multiplexer 31, data-in latch 32, and an input/output buffer 39. Output multiplexer 31 is coupled to memory arrays 15 and 16 via bus 79 and bus 29, respectively. Output multiplexer 31 supplies an output via bus 38 to input/output buffer 39, wherein the output reflects the data stored in either memory array 15 or memory array 16. That output data is the supplied via bus 44 to circuitry external to flash EPROM 20. Bus 44 is a bidirectional bus.

Data to be programmed into flash EPROM 20 is first latched into input/output buffer 39 via bus 44. The data is then supplied to data-in latch 32 via bus 36. Data-in latch 32 is coupled to memory arrays 15 and 16 via bus 30.

Vpp is the erase/program power supply voltage for flash EPROM 20. Vcc is the device power supply for flash EPROM 20 and Vss is ground. In one embodiment Vpp is approximately 12.0 volts and Vcc is approximately 5.0 volts.

In the absence of the high Vpp voltage on the Vpp input pin, flash EPROM 20 acts as a read-only memory. The data stored at an address supplied via address bus 33 is read from either memory array 15 or memory array 16. The data is supplied to input/output buffer 39 via output multiplexer 31 and either bus 29 or bus 38. The data is then supplied via bus 44 to circuitry external to flash EPROM 20.

Flash EPROM 20 has two control functions inputs—namely, chip enable $\overline{CE}$ and output enable $\overline{OE}$. Chip enable input $\overline{CE}$ is the power control and is used for device selection. The output enable input $\overline{OE}$ is the output control for flash EPROM 20 and is used to gate data from the output pins independent of device selection. Both of the control functions $\overline{CE}$ and $\overline{OE}$ must be logically active low to obtain data at the output of flash EPROM 20.

X decoder 21 is the row decoder for memory array 15. Y decoder 23 is the column decoder for memory array 15. Address register 25 is the address register for memory array 15.

X decoder 22 is the row decoder for memory array 16. Y decoder 24 is the column decoder for memory array 16. Address register 26 is the address register for memory array 16.

Address register 25 receives addresses for memory array 15 from address bus 33. Address register 26 receives addresses for memory array 16 from address bus 33. Address registers 25 and 26 latch their respective addresses for their respective memory arrays from address bus 33 during read, program, or erase operations.

X decoder 21 couples all the word lines to memory array 15. X decoder 21 receives X addresses from address register 25. During a read or program operation, X decoder 21 selects one word line in accordance with each address supplied by address register 25.

Y decoder 23 is coupled via Y gating circuitry 27 to all the bit lines in memory array 15. Y decoder 23 receives its Y addresses from address register 25. During a read or program operation, Y decoder 23 selects one byte of bit lines (i.e., 8 bit lines) for each of the Y addresses supplied from address register 26. Y gating circuitry 27 is also coupled to (1) output multiplexer 31 via bus 79 and to (2) a data-in latch 32 via bus 30.

X decoder 22 couples all the word lines to memory array 16. X decoder 22 receives X addresses from address register 26. During a read or program operation, X decoder 22 selects one word line in accordance with each X address supplied by address register 26.

Y decoder 24 is coupled via Y gating circuitry 28 to all the bit lines in memory array 16. Y decoder 24 receives its Y addresses from address register 26. During a read or program operation, Y decoder 24 selects one byte of bit lines (i.e., 8 bit lines) for each Y address supplied by address register 26. Y gating circuitry 28 is also coupled to (1) output multiplexer 31 via bus 29 and to (2) data-in latch 32 via bus 30.

During programming of the memory cells of memory array 16, addresses are applied to X decoder 22 and Y decoder 24 from address register 26. X decoder 22 selects one word line for the X address supplied and couples a program voltage Vpp of 12 volts to the selected word line. Y decoder 24 selects one byte of bit lines for the Y address supplied and couples program voltage Vp to the selected bit lines. In one embodiment, Vp is approximately +7 volts. The input data determines the presence or absence of the Vp voltage on the selected bit lines.

Erasure of one of the memory arrays 15 or 16 can be a full array erasure. For full array erasure, a Vpp voltage is applied to the sources of all the memory cells in one memory array of flash EPROM 20.

In one embodiment, memory arrays 15 and 16 are organized into blocks where each block includes a block common source line. For that embodiment, either a full array erasure or a block erasure can be performed.

For block erasure, erasure is one block at a time. A block decoder (not shown) decodes each of the blocked memory arrays. A block address is applied to the block decoder associated with the memory array that is having one of its block erased. The block decoder couples a Vpp voltage to the selected common source line of the selected block. In this way, only the source regions of the memory cells of the selected block are coupled to $V_{PP}$ during the block erasure operation. The source regions of the memory cells in the unselected blocks remain uncoupled the $V_{PP}$ voltage.

The block decoder for each blocked memory array is coupled to the common source lines for all the blocks within the memory array. For word line blocks each block decoder receives an X address from the associated address register. For bit line blocks, each block decoder receives a Y address from the associated address register. The block decoder then selects one block by selecting the common source line associated with the selected block for any given block address. For example, in one embodiment, memory array 15 is organized into word line blocks. The block decoder for memory array 15 receives an X address from address register 25. The block decoder for memory array 15 then selects one block in memory array 15 by selecting the common source line associated with the selected block.

For that embodiment, each of the blocks has only one common source line coupled to its associated block decoder. Therefore, only a subset of the X address determines which block has been selected and, conversely, which block has not been selected. In one embodiment with word line blocks, the block decoder associated with memory array 15 is an intermediate decoding stage of an X decoder 21. The block decoder associated with memory array 16 is an intermediate decoding stage of X decoder 22.

For an embodiment with bit line blocking, the block decoder associated with memory array 15 is an intermediate decoding stage of Y decoder 23. The block decoder associated with memory array 16 is an intermediate decoding stage of Y decoder 24.

In an alternative embodiment, there is a separate block decoder for each of memory arrays 15 and 16.

Flash EPROM 20 includes a command register 53 and a state control circuitry 52. State control circuitry 52 acts as an internal state machine for EPROM 20.

Command register 53 itself does not occupy an addressable memory location. Instead, command register 53 is a latch used to store the command along with the address and data information needed to execute the command.

In one embodiment, device operations for flash EPROM 20 include read, program/read, and erase/read. Those operations are selected by writing specific commands into the command register 53 via buses 44 and 45. Command register 53 is written to by CPU 12 (shown in FIG. 2) or any other microprocessor external to flash EPROM 20. Standard commands include erase, erase verify, program, program verify, and read. In the presently preferred embodiment, the contents of command register 53 default to (1) the erase/read command when CPU 12 issues the erase command and to (2) program/read when CPU 12 issues the program command.

Command register 53 is alterable when line 40 is at the Vpp voltage of 12 volts. A high voltage detector 54 receives the voltage Vpp via line 40 and applies a $V_{PPH}$ signal—indicative of the high voltage Vpp—to command register 53 via line 42. Command register 53 then sends a signal to state control circuitry 52 for state control circuitry 52 to initiate erasure and programming of memory arrays 15 and 16.

When the high voltage Vpp is removed, the $V_{PPH}$ signal goes low and the contents of command register 53 default to the read command. Flash EPROM 20 then acts as a read-only memory.

In an alternative embodiment, the voltage Vpp is constantly supplied to command register 53. All operations of flash EPROM 20 are then performed in conjunction with command register 53.

For the preferred embodiment of FIG. 3, commands to be loaded into command register 53 are supplied from CPU 12 (of FIG. 2). The commands are supplied via bus 44, input/output buffer 39, and bus 45. Command register 53 is written to by bringing a write enable $\overline{WE}$ signal to logical low level while the chip enable signal $\overline{CE}$ is low.

NOR gate 70 controls the passage of the $\overline{WE}$ signal when the $\overline{CE}$ signal is active low. The output of NOR gate 70 is coupled to command register 53, state control circuitry 52, and array select circuitry 50. The write enable signal $\overline{WE}$ is active low. Addresses are latched into either address register 25 or address register 26 on the falling edge of the write enable pulse. The rising edge of the write enable pulse $\overline{WE}$ latches the command into command register 53 and the data into data-in latch 32. The rising edge of the $\overline{WE}$ initiates an erase/program operation. Write enable pulses $\overline{WE}$ are supplied by CPU 12 in FIG. 12. Standard microprocessor write timings are used in a preferred embodiment.

State control circuitry 52 receives its input from command register 53 via bus 41. State control circuitry 52 controls the operation of flash EPROM 20. State control circuitry 52 controls erase voltage switches 55 and 56 and program voltage switches 57 and 58. This in turn controls the erasure and programming of memory arrays 15 and 16. State control circuitry 52 controls the latching of addresses into address registers 25 and 26. State control circuitry 52 also controls the latching of data into data-in latch 32.

One of the outputs of state control circuitry 52 is an STB signal. The STB signal is sent to address registers 25 and 26 and to data-in latch 32. The STB signal controls the latching of the addresses into either address registers 25 or address register 26 at the falling edge of the write enable signal $\overline{WE}$. The STB signal controls the latching of the data into data-in latch 32 at the rising edge of the write enable signal $\overline{WE}$.

Another output of state control circuitry 52 is an erase enable signal SELVPS1, which is sent to erase voltage switch 55 via line 47. Erase voltage switch 55 is the erase voltage switch for memory array 15. Erase voltage switch 55 passes the Vpp voltage from line 40 to the sources of memory cells of array 15 via line 60 when switch 55 receives the logical high erase enable signal SELVPS1 via line 47. Electrical erasure for memory array 15 then begins. For an embodiment having full array erasure, all the memory cells in memory array 15 are erased.

In an embodiment in which memory cells are organized into blocks, the Vpp voltage is supplied to the block decoder for memory array 15. The block decoder supplies the Vpp voltage only to the sources of memory cells in the block selected by the block address. Electrical erasure of the selected block then begins. The sources of memory cells in unselected blocks remain at zero volts.

For the embodiment shown in FIG. 3, when the erase enable signal SELVPS1 on line 47 has a logical low voltage, the Vpp voltage on line 40 is not passed to line 60. Therefore the voltage on line 60 goes to zero volts. This terminates the erase operation with respect to memory array 15.

Another output of state control circuitry 52 is an erase enable signal SELVPS2 which is sent to erase voltage switch 56 via line 48. Erase voltage switch 56 is the erase voltage switch for memory array 16. The high voltage Vpp is applied to erase voltage switch 56 via line 40. Erase voltage switch 56 supplies the erase power supply Vpp to the sources of memory cells in memory array 16 via line 61 when switch 56 receives a logical high erase enable signal SELVPS2 via line 48. Electrical erasure of memory array 16 then begins.

In the embodiment in which memory cells in memory array 16 are organized into blocks, the Vpp voltage on line 61 is first supplied to the block decoder for memory array 16. Block erasure within array 16 is then performed with respect to the block indicated by the block address supplied to memory array 16.

When the erase enable signal SELVPS2 on line 48 goes to a logical low value, erase voltage switch 56 no longer supplies a high voltage Vpp level on line 61. The voltage on line 61 goes to zero volts and the erase operation on memory array 16 is terminated.

Another output of state control circuitry 52 is program enable bar signal PROB1 for memory array 15. The PROB1 signal is sent to program voltage switch 57 via line 49. The high Vpp program voltage is also applied to program voltage switch 57 via line 40. When the PROB1 signal on line 49 has a logical low value, program voltage switch 57 supplies the Vpp voltage via line 62 to X decoder 21 and Y decoder 23. This initiates a program operation with respect to memory array 15. The Vpp voltage is lowered to program voltage Vp at Y decoder 23. In the currently preferred embodiment, Vpp is approximately +12 volts and Vp is approximately +7 volts.

The X address for memory array 15 is supplied to X decoder 21 from address register 25. With the X address supplied, X decoder 21 selects one word line and applies the Vpp voltage to the selected word line. The Y address for memory array 15 is supplied to Y decoder 23 from address register 25. With the Y address supplied, Y decoder 23 selects a byte of bit lines and applies the Vp voltage to the selected bit lines.

The data to be programmed into memory array 15 is latched into data-in latch 32 via input/output buffer 39 and buses 44 and 36. Y gating circuitry 27 receives the data from data-in latch 32 via bus 30 and determines which of the selected bit lines should be supplied with the Vp voltage. Thus, the presence or absence of a Vp voltage on a selected bit lines depends upon the data in data-in latch 32.

When the program enable bar signal PROB1 on line 49 takes on a logical high value, line 62 goes to zero volts. This terminates the program operation with respect to memory array 15.

State control circuitry 52 also includes a program enable bar signal PROB2 for memory array 16. The PROB2 signal is sent to program voltage switch 58 via line 59. The Vpp voltage is applied to program voltage switch 58 line 40. When the PROB2 signal on line 59 has a logical low value, program voltage switch 58 supplies the Vpp voltage via line 63 to X decoder 22 and Y decoder 24. This initiates a program operation with respect to memory array 16. The Vpp voltage is lowered to program voltage Vp at Y decoder 24.

X decoder 22 receives its X address for memory array 16 from address register 26. With the X address supplied, X decoder 22 selects one word line and applies the Vpp voltage to the selected word line. Y decoder 24 receives its Y address for memory array 16 from address register 26. With the Y address supplied, Y decoder 24 selects a byte of bit lines and applies the Vp voltage to the selected bit lines.

The data to be programmed into memory array 16 is latched into data-in latch 32 via input/output buffer 39 and buses 44 and 36. Y gating circuitry 28 receives the data from data-in latch 32 via bus 30 and determines which of the selected bit lines should be supplied with the Vp voltage. Thus, the presence or absence of a Vp voltage on a selected bit lines depends on the data in data-in latch 32.

When the program enable bar signal PROB2 on line 59 takes on a logical high value, line 63 goes to zero volts. This terminates the program operation with respect to memory array 16.

In one alternative embodiment, flash EPROM 20 also includes internal write automation. Internal write automation automates the programming and erasing of flash EPROM 20. Internal write automation reduces the amount of control CPU 12 needs to exercise over EPROM 20.

Internal write automation is achieved by having a write state machine replace state control circuitry 52. The write state machine contains erase and program algorithms. Program verify and erase verify modes are controlled by the write state machine. After an erase command or a program command is received by EPROM 20, the write state machine controls the sequencing of various circuits within EPROM 20 to control program, program verify, erase, and erase verify operations. This frees CPU 12 for other tasks.

CPU 12 keeps informed of the status of the write state machine by accessing a status register of the write state machine. The status register stores the status of the write state machine. The write state machine also includes a period counter, an event counter, a next state controller, an oscillator phase generator, synchronization circuitry, and a data latch/comparator. The period counter generates four unique periods for (1) the program and erase pulse widths and (2) verify delays. The event counter sets a limit on the number of program/erase pulses applied to either of the memory arrays 15 and 16. The oscillator and phase generator generates clock signals for synchronization circuitry. The synchronization circuitry synchronizes command register 53 with the write state machine. The data latch/comparator compares the output of output multiplexer 31 with the data latched in the data latch/comparator for reprogramming. The next state controller controls and coordinates the activities of the write state machine and determines the next state of the write state machine.

A command port is included with the write state machine. The command port provides an interface between the write state machine and CPU 12.

With respect to the embodiment shown in FIG. 3, flash EPROM 20 includes array select circuitry 50 and pass logic circuitry 51. Array select circuitry 50 determines for a reprogramming operation which array of arrays 15 and 16 is selected for reprogramming and which is selected for reading. Array select circuitry 50 applies its control signal AS (1) to pass logic circuitry 51 via line 64, (2) to state control circuitry 52 via line 65, and (3) to output multiplexer 31 via line 66.

Pass logic circuitry 51 controls the latching of the addresses into address register 25 and address register 26. One of the output signals of pass logic circuitry 51 is a PASSA signal. The PASSA signal is sent to address register 25 via line 35. The PASSA signal controls the latching of addresses into address register 25. The other output signal of pass logic circuitry 51 is a PASSB signal. The PASSB signal is sent to address register 26 via line 37. The PASSB controls the latching of addresses into address register 26.

In a preferred embodiment, each of the addresses on address bus 33 includes 17 bits of address information—namely, bits A0 to A16. Bits A0 through A15 are sixteen bits that form the array address that is latched into either address register 25 or address register 26. The remaining bit A16 is the array select bit. Array select bit A16 contains the array select information that determines which of the memory arrays 15 and 16 the array address is directed to. Bit A16 therefore determines which one of the address registers 25 and 26 receives the array address.

In an alternative embodiment, the array select bit may be one of the other address bits A0 through A15.

During a read operation with respect to one of the memory arrays 15 and 16, the Vpp voltage is not applied to flash EPROM 20. The output signal $V_{PPH}$ of high voltage detector 54 therefore has a logical low value. Addresses are applied to address bus 33. The A16 address bit is sent to array select circuitry 50 via line 67. A logical low A16 address bit selects memory array 15 and a logical high A16 address bit selects memory array 16. The low $V_{PPH}$ signal causes the A16 signal to pass through array select circuitry 50 and become the AS signal. The AS signal is applied to state control circuitry 52 via line 65 and to output multiplexer 31 via line 66. Pass logic circuitry 51 also receives the AS signal via line 64 from array select circuitry 50. Pass logic circuitry 51, however, is unable to react to the AS signal because of the low $V_{PPH}$ signal supplied to pass logic circuitry 51. Output signals PASSA and PASSB of pass logic circuitry 51 both default to logical high. The high PASSA and PASSB signals turn both address registers 25 and 26 on. The address on address bus 33 is passed through both address registers 25 and 26 and the read operation is performed with respect to both memory arrays 15 and 16.

Which one of the outputs of arrays 15 and 16 is coupled to the input/output buffer 39 is determined by output multiplexer 31. The AS signal supplied to output multiplexer 31 controls multiplexer 31. When bit A16 has a logical low value, output multiplexer 31 passes the data on bus 79 to bus 38. The data on bus 29 is not passed to bus 38. Thus, only the data from memory 15 is supplied to input/output buffer 39. When bit A16 has a logical high value, output multiplex 31 passes the data on bus 29 to bus 38. The data on bus 79 is not passed to bus 38. Thus, only the data from memory array 16 is supplied to input/output buffer 39.

During an erase/read operation, the Vpp voltage is applied to flash EPROM 20. High voltage detector 54 outputs a logical high $V_{PPH}$ signal. An erase command is issued by CPU 1 to command register 53. An erase address is applied to address bus 33, indicating which one of memory arrays 15 and 16 is selected for the erase operation. The A16 address bit of the address is applied to array select circuitry 50 via line 67.

For the embodiment in which memory arrays 15 and 16 are organized into blocks, the erase address also contains information as to which block is to be erased.

Array select circuitry 50 acts as a latch when the $V_{PPH}$ signal is at a logical high level. Array select circuitry 50 latches the A16 address select bit under the control of the $\overline{WE}$ signal. When the $\overline{WE}$ signal gates to a logical low level, the A16 bit is latched into array select circuitry 50 at the falling edge of the $\overline{WE}$ signal. When latched into array select circuitry 50, the A16 bit becomes the AS signal, which is then sent to pass logic circuitry 51 via line 64.

If the AS signal supplied to pass logic circuitry 51 has a logical low value (i.e., bit A16 has a logical low value), then pass logic circuitry 51 outputs a logical low PASSA signal and a logical high PASSB signal. If the AS signal supplied to pass logic circuitry 51 has a logical high value (i.e., bit A16 has a logical high value), then pass logic circuitry 51 outputs a logical high PASSA signal and a logical low PASSB signal. In other words, the PASSA and PASSB signals are complementary.

If the AS signal is low, then the logical low PASSA signal is applied to address register 25 and the logical high PASSA signal is applied to register 26. Address register 25 latches the erase address from bus 33 under the control of the STB signal supplied by state control circuitry 52. The STB signal is a logically active low signal. The initial erase address is latched in address register 25 at the falling edge of the STB signal. The logical high PASSB signal enables address register 26, and allows address register 26 to read subsequent addresses supplied to it by bus 33.

The AS signal is also applied to state control circuitry 52 via line 65. If the AS signal has a logical low value, then state control circuitry 52 outputs a logical high erase enable signal SELVPS1 to erase voltage switch 55 and SELVPS2 is kept logically low. If the AS signal has a logical high value, then state control circuitry 52 outputs a logical high erase enable signal SELVPS2 to erase voltage switch 56 and SELVPS1 is kept logically low. If SELVPS1 is logically high and SELVPS2 is logically low, then the Vpp voltage applied as part of the erase operation is applied to memory array 15 via line 60. The erase operation then is initiated at memory array 15 and not memory array 16.

Given that the PASSB signal is at logical high level, address register 26 does not act as a latch. Any subsequent address applied to address bus 33 passes through address register 26 and is supplied to address memory array 16 as part of a read operation. The data read from memory array 16 is then coupled to output multiplexer 31 via bus 29. The AS signal also controls output multiplexer 31 at this time to couple the data from memory array 16 to input/output buffer 39.

The read operation on memory array 15 is, however, prohibited when the $V_{PPH}$ signal is at logical high level and the $\overline{WE}$ signal is active low. Address register 25 is latched with the erase address.

If, however, the AS signal has a logical high value, then the logical high PASSA signal is applied to address register 25 and the logical low PASSB signal is applied to address register 26. A logical high AS signal means that signal SELVPS2 is logically high and SELVPS1 is logically low. The Vpp erase voltage is applied to memory array 16 and not memory array 15. Address register 26 latches the erase address. Erasure of array 16 is initiated. Address register 25 is enabled and memory array 15 can be read from. Output multiplexer 31 supplies input/output buffer 39 with data read from memory array 15 via buses 79 and 38.

During a program/read operation, the high Vpp voltage is applied to the Vpp pin of flash EPROM 20. High voltage detector 54 detects the Vpp voltage and sends a logic high $V_{PPH}$ signal to array select circuitry 50 and pass logic circuitry 51. A $\overline{WE}$ signal is sent to command register 53 from CPU 1. A program address is supplied to address bus 33.

Bit A16 of the address is applied to array select circuitry 50 via line 67. Bit A16 indicates which memory array of arrays 15 and 16 is to be programmed. Array select circuitry 50 acts as a latch when the $V_{PPH}$ signal is at a logical high level. Array select circuitry 50 latches the A16 address bit under the control of the $\overline{WE}$ signal. The A16 address bit is latched into array select circuitry 50 at the falling edge of the $\overline{WE}$ signal. When latched into array select circuitry 50, the A16 address bit becomes the AS signal that is sent to pass logic circuitry 51 via line 64.

If the AS signal supplied to pass logic circuitry 51 has a logical low value (i.e., bit A16 has a logical low value), then pass logic circuitry 51 outputs a logical low PASSA signal and a logical high PASSB signal. If the AS signal supplied to pass logic circuitry 51 has a logical high value (i.e., bit A16 has a logical high value), then pass logic circuitry 51 outputs a logical high PASSA signal and a logical low PASSB signal.

If the AS signal is logically high, then the logical high PASSA signal is applied to address register 25 and the logical low PASSB signal is applied to address register 26. Address register 26 latches the program address from address bus 33 under the control of the STB signal supplied by state control circuitry 52. The address is latched in address register 26 at the falling edge of the STB signal.

The data to be programmed is latched into data-in latch 32 under the control of the STB signal. The data is latched into data-in latch 32 at the rising edge of the STB signal.

The AS signal is also applied to state control circuitry 52 via line 65. If the AS signal has a logical high value, then state control circuitry 52 outputs a logical low program enable bar signal PROB2 to program voltage switch 58 and program enable bar signal PROB1 is kept logically high. If, on the other hand, the AS signal has a logical low value, then state control circuitry 52 outputs a logical low program enable bar signal PROB1 to program voltage switch 57 and program enable bar signed PROB2 is kept logically high.

If AS is logically high, PROB2 is logically low, and PROB1 is logically high, then the high program Vpp voltage is then applied to X decoder 22 and Y decoder 24 via line 63. The high program voltage Vpp is lowered to the Vp voltage level at Y decoder 24. A program operation is then initiated in memory array 16.

If the PASSA signal from pass logic circuitry 51 is at logical high level, address register 25 does not act as a latch. Rather, address register 25 is turned on by the high PASSA signal. Any subsequent address applied to address bus 33 passes through address register 25 and is supplied to memory array 15 as part of a read operation. The data read from memory array 15 is then coupled to output multiplexer 31 via bus 79 under the control of the AS signal.

If, however, the AS signal has a logical low value, then the logical low PASSA signal is applied to address register 25 and the logical high PASSB signal is applied to address register 26. A logical low AS signal means that the PROB1 signal is logically low and the PROB2 signal is logically high. The high program voltage Vpp is then applied to Y decoder 23 and X decoder 21 for memory array 15. The voltage Vpp is lowered to the Vp voltage level at Y decoder 23. Address register 25 latches the program address. Data-in latch 32 latches the data to be programmed. Programming of memory array 15 is initiated. Address register 26 is enabled and memory array 16 can be read from. Output multiplexer 31 supplies input/output buffer 39 with data read from memory array 16 via buses 29 and 38.

In one preferred embodiment, memory arrays 15 and 16 each includes a boot block (not shown) that stores boot information. As described above, boot information contains information for system initialization and reprogramming. Boot blocks require minimal updating. While memory array 15 is being reprogrammed, CPU 12 can use a read operation to access the boot block in memory array 16 for boot information. On the other hand, when memory array 16 is being reprogrammed, CPU 12 can use a read operation to access the boot block in memory array 15 for boot information.

Figure 4:
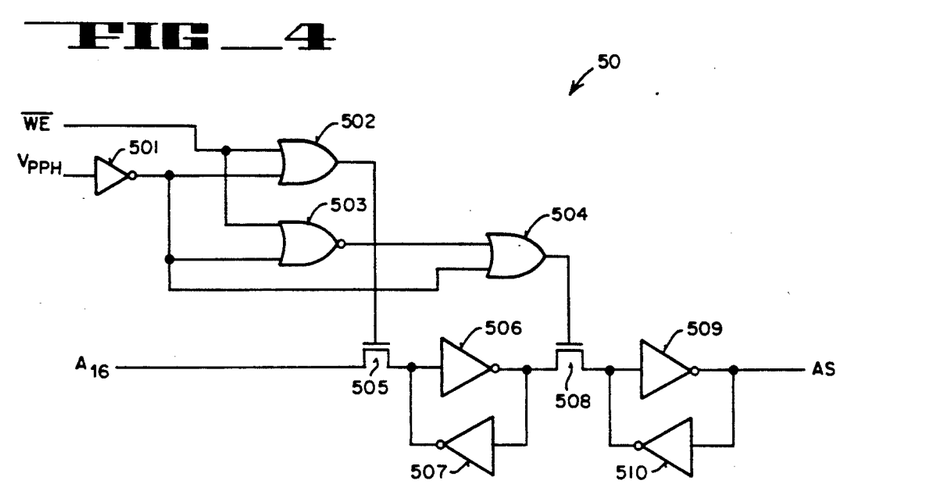
FIG. 4 illustrates array select circuitry.

FIG. 4 illustrates circuitry of array select circuitry 50 of FIG. 2. As shown in FIG. 4, array select circuitry 50 includes (1) a first latch formed by inverter 506 and inverter 507, and (2) a second latch formed by inverter 509 and inverter 510.

In the preferred embodiment, transistors 505 and 508 are N-channel transistors. The output of the first latch is coupled to the drain of a second gate transistor 508.

In an alternative embodiment, transistors 505 and 508 are P-channel transistors.

The $\overline{WE}$ signal is coupled as an input to OR gate 502. The $V_{PPH}$ signal is applied as an input to inverter 501. The output of inverter 501 is supplied as another input to OR gate 502. The output of OR gate 502 is connected to the gate of transistor 505. The drain of transistor 505 is connected to bit A16 of the address, which is the array select bit. The A16 signal is applied to array select circuitry 50 via line 67 (see FIG. 3).

When transistor 505 is turned on by either $\overline{WE}$ or $V_{PPH}$, the A16 signal passes through transistor 505 and into the first latch formed by inverters 506 and 507. If transistor 508 has been switched off, the A16 signal will be latched into the first latch and held there. When transistor 508 is switched on, the A16 signal passes through transistor 508 and into the second latch formed by inverters 509 and 510. The A16 signal becomes the output signal AS of circuitry 50.

The $\overline{WE}$ signal is also coupled to an input of NOR gate 503. The output of inverter 501 is also connected to another input of NOR gate 503. The output of NOR gate 503 is coupled to an input of OR gate 504. The output of inverter 501 is also coupled to another input of OR gate 504. The output of OR gate 504 is connected to the gate of transistor 508.

When $V_{PPH}$ signal is at logical low level (which indicates that flash EPROM 20 is acting as a read-only memory), the outputs of OR gates 502 and 504 are logically high and both transistors 505 and 508 are switched on. Array select circuitry 50 accordingly does not respond to the $\overline{WE}$ signal and the A16 signal is passed through the circuitry 50 to become the AS output.

When the $V_{PPH}$ signal is logically high (which indicates that flash EPROM 20 is erasable or programmable), both transistors 505 and 508 are under control of the $\overline{WE}$ signal. When the $\overline{WE}$ signal is logically high, transistor 505 is on while transistor 508 is off. The A16 signal is then latched into the first latch (i.e., inverters 506 and 507) and held there. When the $\overline{WE}$ signal becomes logically low, transistor 508 is switched on and transistor 505 is turned off. This sends the A16 signal from the first latch to the second latch formed by inverters 509 and 510. The output of the second latch is the AS signal.

Figure 5:
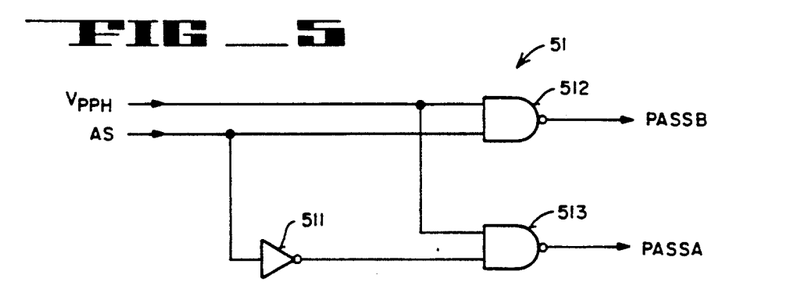
FIG. 5 illustrates pass logic circuitry.

FIG. 5 illustrates circuitry of pass logic 51. Pass logic circuitry 51 includes an inverter 511 and NAND gates 512 and 513. The AS signal and the $V_{PPH}$ signal are applied as inputs to pass logic circuitry 51. When the $V_{PPH}$ is a logical low signal (i.e., flash EPROM 20 is a read-only memory), the PASSA and PASSB signals are both logically high, regardless of the AS signal. When the $V_{PPH}$ signal is logically high, the PASSA and PASSB signals are determined by the AS signal. If AS is logically low, then PASSA is low and PASSB is high. If AS is logically high, then PASSA is high and PASSB is low.

Figure 6:
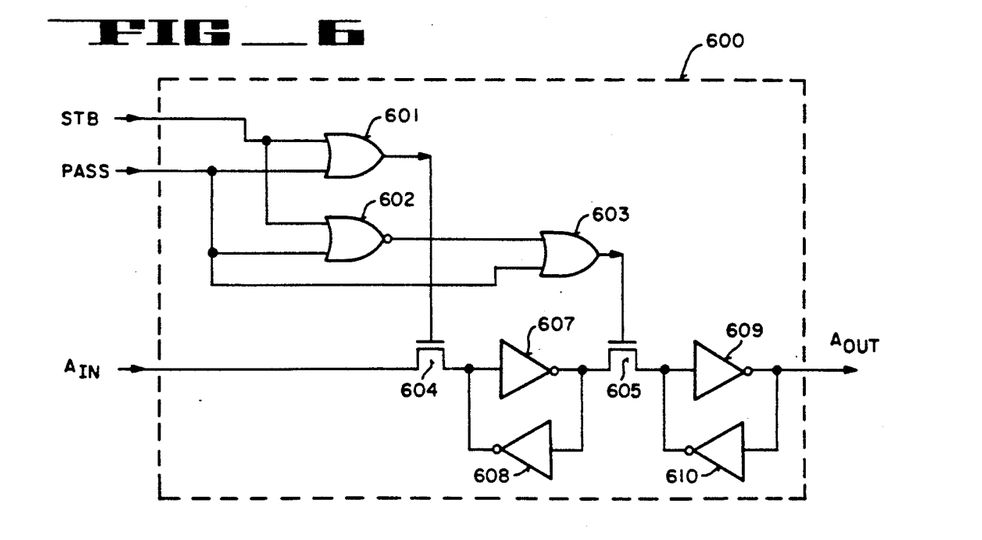
FIG. 6 illustrates the circuitry of one bit of the address register of the flash EPROM of FIG. 3.

FIG. 6 illustrates the circuitry of a single bit address register of either address register 25 or address register 26. FIG. 6 shows bit address register 600. $A_{IN}$ represents one bit of an incoming address. $A_{OUT}$ represents the output of bit address register 600. Bit address register 600 includes (1) a first address latch formed by inverters 607 and 608 and (2) a second address latch formed by inverters 609 and 610. The first latch is coupled to the second latch via transistor 605, which acts as a gate to the second address latch. The input bit address $A_{IN}$ is coupled to the first address latch via a transistor 604, which acts as a gate of the first address latch. The output of the second address latch is the output $A_{OUT}$ of bit address register 600.

In one preferred embodiment, transistors 604 and 605 are N-channel transistors. In an alternative embodiment, transistors 604 and 605 are P-channel transistors.

Bit address register 600 includes two control signals—namely, the PASS signal and the STB signal. The STB signal is applied to the inputs of OR gate 601 and the NOR gate 602. The PASS signal is applied to the inputs of OR gates 601 and 603 and to the input of NOR gate 602. If bit address register 600 is a bit register for address register 25, the PASS signal is the PASSA signal. If, on the other hand, bit address register 600 is a bit register for address register 26, then the PASS signal is the PASSB signal.

When the PASS signal is logically high, transistor 604 is switched on by the output from OR gate 601. When the PASS signal is logically high, transistor 605 is switched on also by the output of OR gate 603. When transistors 604 and 605 are on, the $A_{IN}$ address signal passes through bit address register 600 and becomes the $A_{OUT}$ signal. When the PASS signal is logically low and the STB signal is logically high, transistor 604 is on and transistor 605 is off. The $A_{IN}$ address is latched by the first address latch and held there. When the STB signal switches to a logical low value, transistor 604 is turned off and transistor 605 is turned on. The $A_{IN}$ address stored in the first address latch moves into the second address latch. The input $A_{IN}$ thereupon becomes the output $A_{OUT}$.

In the foregoing specification the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A floating gate nonvolatile memory circuitry residing on a single silicon substrate, comprising:
    a first memory array;
    a first address register for storing a first address for the first memory array;
    a second memory array;
    a second address register for storing a second address for the second memory array;
    a multiplexer coupled to the first memory array and the second memory array at a first end and an output of the memory circuitry at a second end for selectively coupling one of the first memory array and the second memory array to the output at a time;
    array select circuitry responsive to (1) incoming array select information associated with the first address and (2) memory operation control information for selecting the first memory array for a reprogramming operation and for allowing a read operation with respect to the second memory array during the reprogramming operation of the first memory array, wherein the array select circuitry directs the first address to the first address register for the reprogramming operation in response to the incoming array select information and the memory operation control information received and directs the second address to the second address register for the read operation during the reprogramming operation of the first memory array, wherein the array select circuitry prevents the second address from entering the first address register during the reprogramming operation of the first memory array, wherein the array select circuitry controls the multiplexer for coupling the second memory array to the output during the reprogramming operation of the first memory array and the read operation of the second memory array such that the second memory array can undergo the read operation when the first memory array is undergoing the reprogramming operation.

2. The memory circuitry of claim 1, wherein the first memory array includes a first memory cell that is electrically erasable and electrically programmable, and wherein the second memory array includes a second memory cell that is electrically erasable and electrically programmable.

3. The memory circuitry of claim 2, wherein the reprogramming operation includes an erase operation and a programming operation.

4. The memory circuitry of claim 1, further comprising a state control means for performing the reprogramming operation.

5. The memory circuitry of claim 4, wherein the state control means is a write state machine, wherein the write state machine provides write automation.

6. The memory circuitry of claim 1, wherein the first memory array is arranged into a plurality of bit line blocks, wherein the memory circuitry further includes a first block decoder coupled to the plurality of bit line blocks of the first memory array.

7. The memory circuitry of claim 1, wherein the first memory array is arranged into a plurality of word line blocks, wherein the memory circuitry further includes a first block decoder coupled to the plurality of word line blocks of the first memory array.

8. The memory circuitry of claim 1, wherein the array select circuitry further includes pass logic circuitry that controls latching of the first address into the fist address register and the second address into the second address register during the reprogramming operation.

9. The memory circuitry of claim 1, wherein the first memory array includes a first main block, a first boot block, and a first parameter block, wherein the first boot block includes reprogramming write lockout circuitry.

* * * * *